United States Patent
Moon

(10) Patent No.: US 8,049,649 B2
(45) Date of Patent: Nov. 1, 2011

(54) PARALLEL-TO-SERIAL CONVERSION CIRCUIT AND METHOD THEREOF

(75) Inventor: Jinyeong Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/717,361

(22) Filed: Mar. 4, 2010

(65) Prior Publication Data
US 2011/0102211 A1  May 5, 2011

(30) Foreign Application Priority Data
Oct. 29, 2009  (KR) .................. 10-2009-0103623

(51) Int. Cl.
*H03M 9/00* (2006.01)
(52) U.S. Cl. .................... 341/101; 341/100
(58) Field of Classification Search .................. 341/101, 341/100
See application file for complete search history.

(56) References Cited

U.S. PATENT DOCUMENTS
2006/0181444 A1* 8/2006 Wallner et al. ............... 341/101
2008/0122666 A1* 5/2008 Yoshizaki .................... 341/101
* cited by examiner

*Primary Examiner* — Jean Jeanglaude
(74) *Attorney, Agent, or Firm* — IP & T Group LLP

(57) ABSTRACT

A parallel-to-serial conversion circuit for converting pieces of parallel data into serial data, and a parallel-to-serial converting method thereof include: a shifter configured to sequentially shift an initiation signal to generate a plurality of transfer activation signals; a valid duration generator configured to define valid durations of the plurality of pieces of parallel data based on a clock and the plurality of transfer activation signals; and an output unit configured to receive the plurality of pieces of parallel data whose valid duration has been defined and to drive an output in response to a piece of data from among the received parallel data whose valid duration has begun.

21 Claims, 5 Drawing Sheets

US 8,049,649 B2

PARALLEL-TO-SERIAL CONVERSION CIRCUIT AND METHOD THEREOF

CROSS-REFERENCE TO RELATED APPLICATIONS

The present application claims priority of Korean Patent Application No. 10-2009-0103623, filed on Oct. 29, 2009, which is incorporated herein by reference in its entirety.

BACKGROUND OF THE INVENTION

Exemplary embodiments of the present invention relate to a parallel-to-serial conversion circuit for converting parallel data into serial data, and a parallel-to-serial converting method thereof.

Demands for high-speed operation of a semiconductor memory device are increasing day by day, but there are physical limitations in shortening the access time of a core region of the semiconductor memory device, which is a memory cell array region. Semiconductor memory devices overcome the physical limitations of the core region by processing data in parallel internally and serializing the parallel data when the data are inputted or outputted so that data can be inputted and outputted at a high speed. To this end, semiconductor memory devices are equipped with a parallel-to-serial conversion circuit for converting data processed in parallel internally into serial data and for outputting the serial data externally. Diverse integrated circuits other than semiconductor memory devices may perform a data parallel-to-serial conversion in a chip, or a system, if necessary.

FIG. 1 illustrates four parallel data signals converted into a serial data signal. The parallel-to-serial conversion is achieved as data in multiple parallel lines P0, P1, P2 and P3 are sequentially transferred to one line S. As shown in FIG. 1, when the four parallel lines P0, P1, P2 and P3 are loaded with pieces of data D0, D1, D2 and D3, the pieces of data of the four lines P0, P1, P2 and P3 are transferred to the serial line S one by one. Herein, signals CK0, CK1, CK2 and CK3, that determine the instants in time when the pieces of data D0, D1, D2 and D3 arrayed in the parallel lines P0, P1, P2 and P3 are transferred to the serial line S, are generated and used for the parallel-to-serial conversion.

A piece of data D0 of a line P0 is transferred to the serial line S at an instant in time when a signal CK0 is activated, and a piece of data D1 of a line P1 is transferred to the serial line S at an instant in time when a signal CK1 is activated. A piece of data D2 of a line P2 is transferred to the serial line S at an instant in time when a signal CK2 is activated, and a piece of data D3 of a line P3 is transferred to the serial line S at an instant in time when a signal CK3 is activated.

As described above, the parallel-to-serial conversion is performed as pieces of data loaded on multiple parallel lines are sequentially transferred to a serial line. The parallel-to-serial conversion necessarily requires signals that determine the instant in time when the pieces of data are transferred from the multiple parallel lines to the serial line. Such signals will be referred to as data selection signals hereafter. When a parallel-to-serial conversion of a ratio of $2^N:1$, e.g., 2:1, 4:1 or 8:1, is performed, the signals for setting the instant of time when the pieces of data are to be transferred may be easily generated by dividing a clock. For example, the signals CK0, CK1, CK2 and CK3 of FIG. 1 may be easily generated by dividing a clock signal CLK into four clock signals.

A Double Data Rate 4 (DDR4) semiconductor memory device has a burst length (BL) of 10. This signifies that 10 pieces of data are to be outputted consecutively in series and that the parallel-to-serial conversion ratio of 10:1 must be achieved internally in the semiconductor memory device. However, signal division is basically performed in ratios of $2^N$. Therefore, 10 divided clocks which will be used for the parallel-to-serial conversion of a ratio of 10:1 cannot be generated and it therefore becomes complicated to generate the data selection signals for the parallel-to-serial conversion of a ratio of 10:1. For instance, when 8 divided clocks are used as the data selection signals for the parallel-to-serial conversion of a ratio of 10:1, there is no problem in selecting from the first 8 pieces of data but a complicated control circuit is additionally required to select the last 2 pieces of data. Moreover, when the semiconductor memory device has diverse functions added thereto, the complexity of the parallel-to-serial conversion circuit increases at the ratio of a geometrical progression, which is problematic.

SUMMARY OF THE INVENTION

An embodiment of the present invention is directed to a parallel-to-serial conversion circuit and method that can easily perform a parallel-to-serial conversion which is not of a $2^N:1$ ratio.

In accordance with an embodiment of the present invention, a method for generating a data selection signal used to determine an instant in time when each of a plurality of pieces of parallel data is to be transferred to an output to serially array the plurality of pieces of parallel data in the output, the method including: generating first to $N^{th}$ transfer activation signals by sequentially shifting an initiation signal in synchronism with a clock; and generating first to $N^{th}$ data selection signals each activated during a duration in which the clock is one of either a logic high or a logic low and one of the first to $N^{th}$ transfer activation signals is activated.

In accordance with another embodiment of the present invention, a parallel-to-serial conversion circuit for converting a plurality of pieces of parallel data into serial data, the parallel-to-serial conversion circuit including: a shifter configured to sequentially shift an initiation signal to generate a plurality of transfer activation signals; a valid duration generator configured to define valid durations of the plurality of pieces of the parallel data based on a clock and the plurality of the transfer activation signals; and an output unit configured to receive the plurality of pieces of parallel data whose valid duration is defined and to drive an output in response to a piece of parallel data from among the received parallel data whose valid duration has begun.

In accordance with yet another embodiment of the present invention, a parallel-to-serial conversion circuit for converting a plurality of pieces of parallel data into serial data, the parallel-to-serial conversion circuit including: a shifter configured to sequentially shift an initiation signal based on a clock and an inverted clock to generate a plurality of rising transfer activation signals in synchronism with the clock and a plurality of falling transfer activation signals in synchronism with the inverted clock; a rising valid duration generator configured to define valid durations of rising pieces of data from among the plurality of pieces of parallel data based on the clock and the plurality of falling transfer activation signals; a falling valid duration generator configured to define valid durations of falling pieces of data from among the plurality of pieces of parallel data based on the inverted clock and the plurality of the rising transfer activation signals; a rising output unit configured to receive the plurality of pieces of parallel data whose valid duration is defined by the rising valid duration generator and to drive a rising output in response to a piece of data from among the received parallel data whose valid duration has begun; and a falling output unit configured to receive the plurality of pieces of parallel data whose valid duration is defined by the falling valid duration generator and to drive a falling output in response to a piece of data from among the received parallel data whose valid duration has begun.

DESCRIPTION OF THE INVENTION

Figure 1:
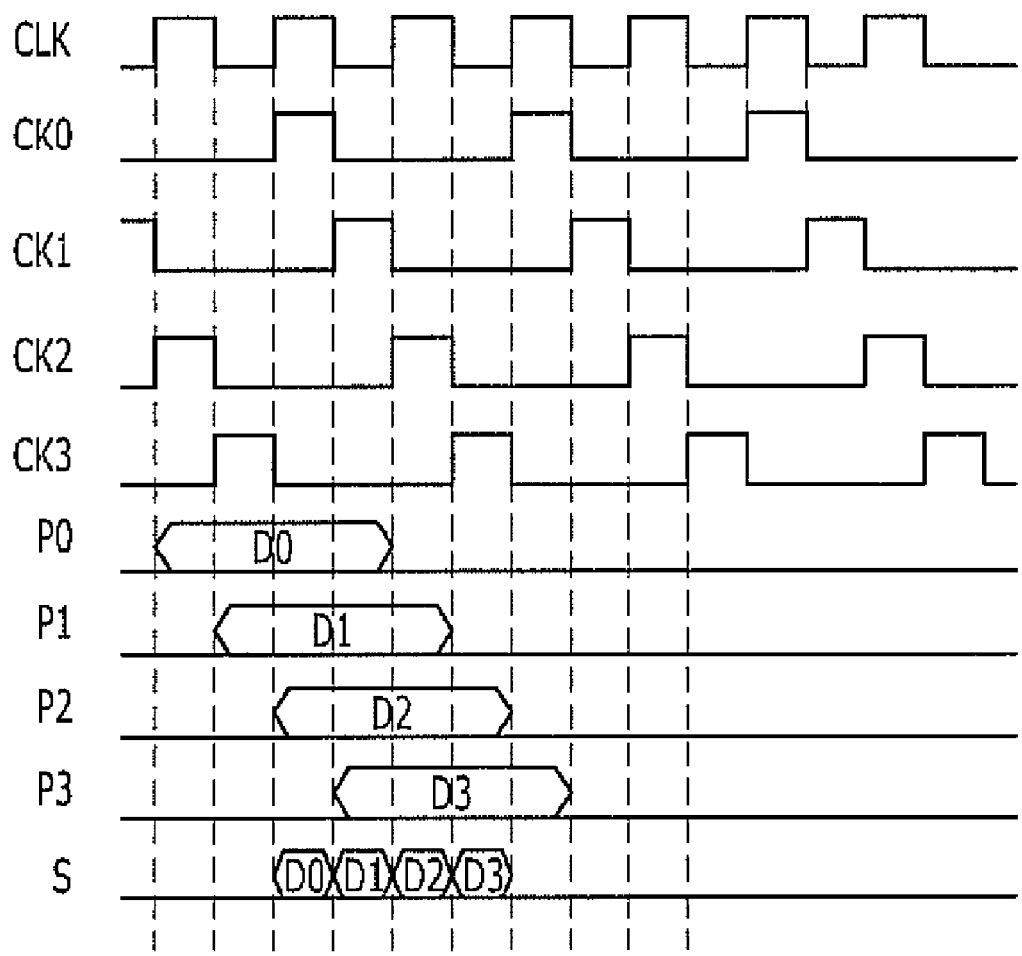
FIG. 1 illustrates four parallel data signals converted into a serial data signal.

Exemplary embodiments of the present invention are described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
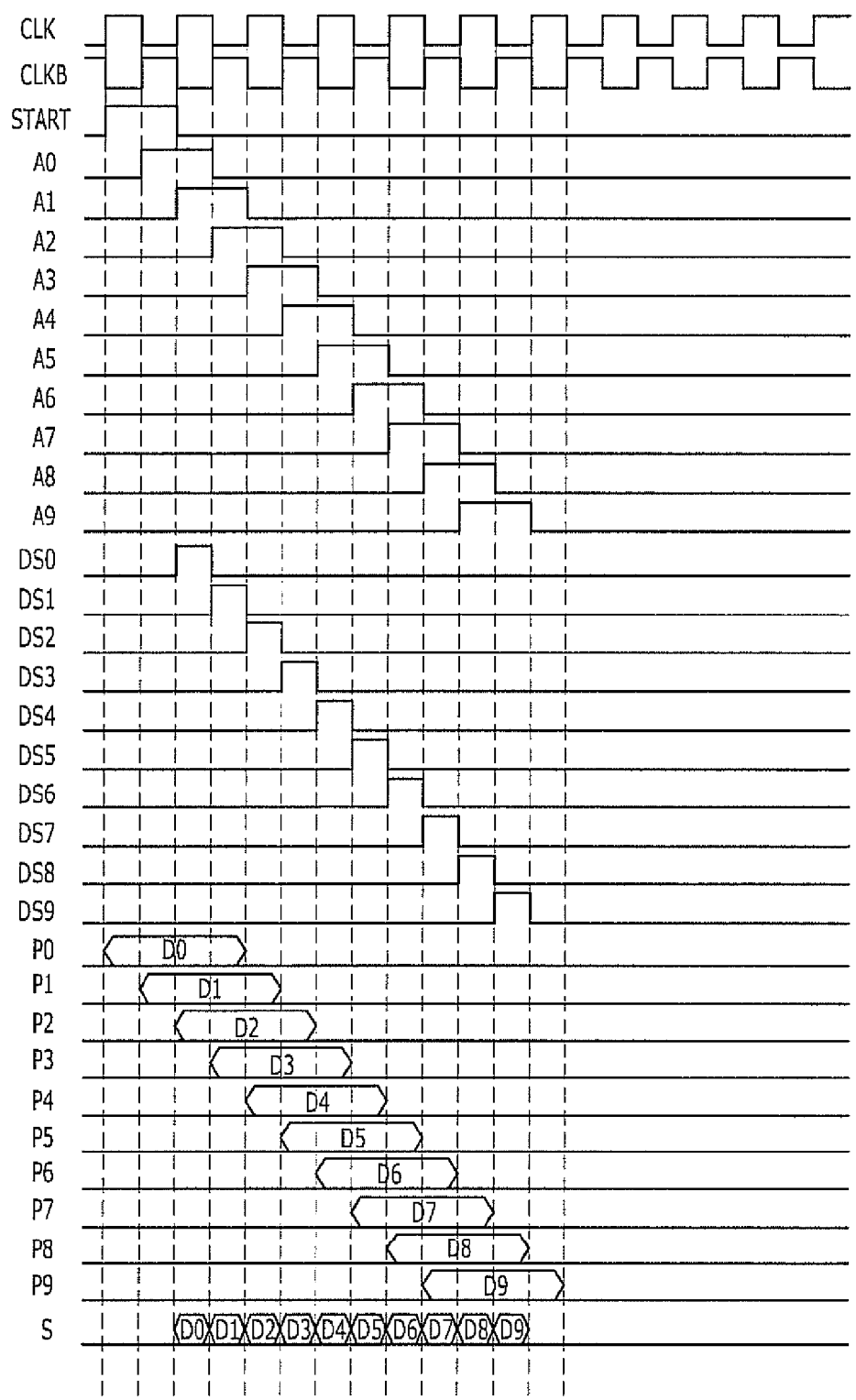
FIG. 2 is a timing diagram describing a method for generating a data selection signal which determines an instant in time when a plurality of pieces of parallel data are transferred to an output to convert the plurality of pieces of parallel data into serial data.

FIG. 2 is a timing diagram describing a method for generating a data selection signal which determines an instant in time when a plurality of pieces of parallel data are converted into serial output data in order to arrange the plurality of pieces of parallel data into serial data. Referring to FIG. 2, data D0 to D9 exist in lines P0 to P9 in parallel. In order to transfer the pieces of data D0 to D9 from the lines P0 to P9 to a serial line S, data selection signals DS0 to DS9 are needed. The data selection signals DS0 to DS9 determine the instants in time when the pieces of data D0 to D9 are to be transferred from the lines P0 to P9 to the serial line S. The data selection signals DS0 to DS9 are generated by the following process.

First, an initiation signal START is sequentially shifted in synchronism with clocks CLK and CLKB. The shifted signals become transfer activation signals A0 to A9. The transfer activation signals A0 to A9 have a phase difference of ½ clock from one another. The initiation signal START is a signal activated just prior to the initiation of a parallel-to-serial conversion. Those skilled in the art to which the present invention pertains may easily design elements to generate the initiation signal START. For example, the initiation signal START may be generated in a semiconductor memory device by using a signal activated at an instant in time of CL-1, which is an instant in time one-clock earlier than the instant in time when data is outputted from a chip.

The transfer activation signals A0 to A9 are combined with a clock CLK to generate the data selection signals DS0 to DS9. Even-number data selection signals DS0, DS2, DS4, DS6 and DS8 are generated when even-number transfer activation signals A0, A2, A4, A6 and A8 are activated and when the clock CLK is a logic high. Odd-number data selection signals DS1, DS3, DS5, DS7 and DS9 are generated when odd-number transfer activation signals A1, A3, A5, A7 and A9 are activated and when the clock CLK is a logic low. The generated data selection signals DS0 to DS9 are not activated during the same duration and the data selection signals DS0 to DS9 respectively correspond to the data D0 to D9.

When the data selection signals DS0 to DS9 are activated, the data D0 to D9 of the lines P0 to P9 are transferred to the serial line S. When a data selection signal DS0 is activated, a piece of data D0 of a line P0 is transferred to the serial line S, and when a data selection signal DS1 is activated, a piece of data D1 of a line P1 is transferred to the serial line S. Likewise, the other pieces of data D2 to D9 are respectively transferred from the lines P2 to P9 to the serial line S. Through the process, all of the pieces of data D0 to D9 loaded on the lines P0 to P9 are transferred to the serial line S. In short, a parallel-to-serial conversion is achieved.

Referring to FIG. 2, the initiation signal START is synchronized with the clocks CLK and CLKB and shifted. The shifted signals A0 to A9 are combined with the clocks CLK and CLKB to generate the data selection signals DS0 to DS9. To sum up, the data selection signals DS0 to DS9 for a parallel-to-serial conversion of a ratio of 10:1 are generated only with a shift operation and a logic combination of a signal without a complicated control process. With this method, it is unnecessary to perform a complicated control process not only for a parallel-to-serial conversion of a ratio of 2^N:1 but also for a parallel-to-serial conversion of a ratio of 10:1 or 18:1.

Figure 3:
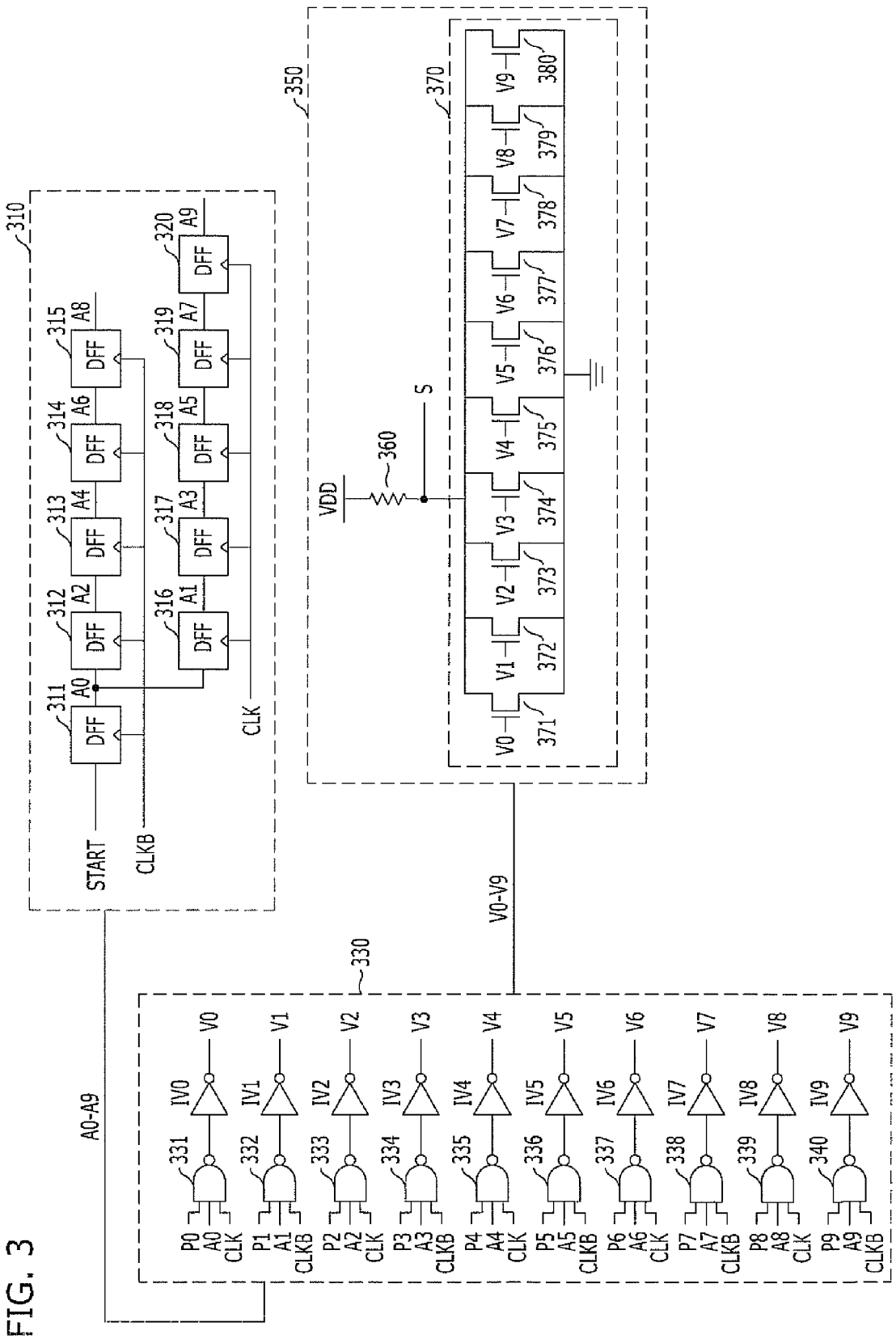
FIG. 3 shows a parallel-to-serial conversion circuit in accordance with an embodiment of the present invention.

FIG. 3 shows a parallel-to-serial conversion circuit in accordance with an embodiment of the present invention. Referring to FIG. 3, the parallel-to-serial conversion circuit includes a shifter 310, a valid duration generator 330 and an output unit 350. The shifter 310 generates a plurality of transfer activation signals by sequentially shifting an initiation signal START. The valid duration generator 330 defines the valid duration of the multiple parallel pieces of data D0 to D9. The output unit 350 receives the multiple parallel pieces of data V0 to V9 whose valid duration is defined and drives an output S in response to data whose valid duration is derived from the inputted parallel pieces of data V0 to V9 whose valid duration is defined.

The shifter 310 sequentially shifts the initiation signal START in synchronism with the clocks CLK and CLKB. The sequentially shifted signals become transfer activation signals A0 to A9. The shifter 310 may be easily realized by using D flip-flops 311 to 320 operating in synchronism with the clocks CLK and CLKB. The initiation signal START and the transfer activation signals A0 to A9 generated by shifting the initiation signal START may be more clearly understood with reference to FIG. 2.

The valid duration generator 330 defines valid durations of the pieces of data D1 to D9 of the lines P1 to P9 based on the clocks CLK and CLKB and the transfer activation signals A0 to A9. Herein, defining a valid duration signifies that the pieces of parallel data V0 to V9 whose valid duration is defined are set at a predetermined logic level regardless of a data value during a duration that is not their valid duration. In the embodiment of FIG. 3, the pieces of parallel data V0 to V9 whose valid duration is defined are set at a low logic level. The valid duration is a duration that a data selection signal described with reference to FIG. 2 is activated. In other words, the valid duration of a piece of parallel data V0 whose valid duration is defined, is a duration in which a data selection signal DS0 is activated, and the valid duration of a piece of parallel data V3, whose valid duration is defined, is a duration in which a data selection signal DS3 is activated. The valid duration generator 330 may include NAND gates 331 to 340 each receiving one of the pieces of parallel data D0 to D9 loaded on the lines P0 to P9, one of the transfer activation signals A0 to A9, and one of the clocks CLK and CLKB, and inverters IV0 to IV9 coupled to the respective outputs of the NAND gates. The data of the lines P0 to P9, inputted to the NAND gates 331 to 340, are outputted to the inverters IV0 to IV9 only during a duration in which both transfer activation signals A0 to A9 and the clocks CLK and CLKB inputted to the NAND gates 331 to 340 are at a logic high. When any of the transfer activation signals A0 to A9 and the clocks CLK and CLKB is a at a logic low level, a logic low level is outputted to the inverters IV0 to IV9, regardless of the pieces of data D0 to D9 loaded on the lines P0 to P9.

The data selection signals DS0 to DS9, described with reference to FIG. 2, are generated by combining the transfer activation signals A0 to A9 with the clocks CLK and CLKB. Thus, it may be said that, in the valid duration generator 330, a operation of generating the data selection signals DS0 to DS9 and an operation of defining a duration (which is a valid duration) that the pieces of data D0 to D9 of the lines P0 to P9 are to be transferred to the serial line S based on the data selection signals DS0 to DS9 are performed simultaneously, For example, a data selection signal DS0 is activated during a duration in which a transfer activation signal A0 and a clock CLK are at a high logic level, and since the transfer activation signal A0, the clock CLK, and a data D0 of a line P0 are simultaneously inputted into a NAND gate 351, a data selection signal DS0 is generated based on the transfer activation signal A0 and the clock CLK and the valid duration of the piece of data D0 is defined based on the data selection signal DS0.

The output unit 350 receives the pieces of parallel data V0 to V9 whose valid duration is defined and drives the output S in response to a piece of data whose valid duration is derived from the inputted parallel pieces of data V0 to V9 whose valid duration is defined. The output unit 350 includes a pull-up driving element 360 for pull-up driving the output S and a pull-down driving element 370 for pull-down driving the output S. The pull-up driving element 360 may be realized as a resistor, and the pull-down driving element 370 may be realized to include parallel transistors 371 to 380 respectively receiving the pieces of parallel data V0 to V9 whose valid duration is defined.

The output unit 350 operates as follows. The parallel data V0 to V9 whose valid duration is defined are inputted to the output unit 350, and they are fixed at a logic low level during a duration that is not their valid duration and thus, they cannot turn on the parallel transistors 371 to 380. For this reason, the pieces of parallel data V0 to V9 whose valid duration is defined do not affect the logic level of the output S in a duration which is not their valid duration. When one piece of data from among the pieces of parallel data V0 to V9 has reached its valid duration, the data has either a logic high value or a logic low value and accordingly, a corresponding parallel transistor from among the parallel transistors 371 to 380 is turned on or off. When the parallel transistor is turned on, the logic level of the output S is a logic low. When the parallel transistor is turned off, the logic level of the output S becomes a logic high. In short, when one piece of data, whose valid duration has begun, from among the pieces of parallel data V0 to V9 whose valid duration is defined, is a logic high, the logic level of the output S is a logic low. When one piece of data, whose valid duration has begun, from among the pieces of parallel data V0 to V9, whose valid duration is defined, is a logic low, the logic level of the output S is a logic high. Accordingly, the pieces of parallel data V0 to V9, whose valid duration is defined, are inverted in the output S and serially arrayed data are loaded. As described before, pieces of data are inverted in the course of a parallel-to-serial conversion. The data inversion may be obviated by disposing an inverter (not shown) just prior to the output S of the output unit 350.

The lines P0 to P9 shown in FIG. 3 correspond to the lines P0 to P9 shown in FIG. 2, and the output S shown in FIG. 3 corresponds to the output S shown in FIG. 2, except that a data is inverted in the output S. Therefore, the operation of FIG. 3 may be more clearly understood by referring to FIG. 2.

Figure 4:
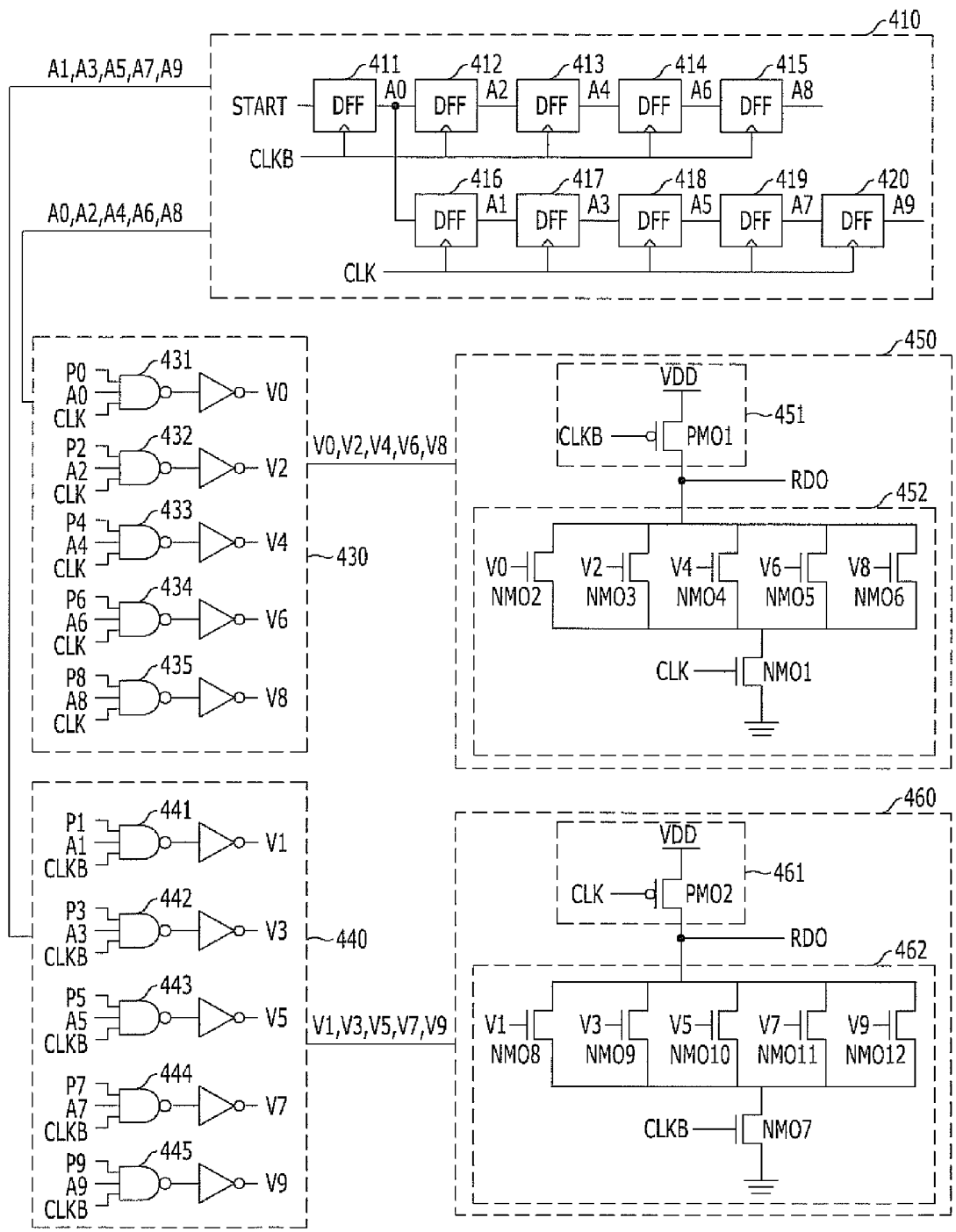
FIG. 4 shows a parallel-to-serial conversion circuit in accordance with another embodiment of the present invention.

FIG. 4 shows a parallel-to-serial conversion circuit in accordance with another embodiment of the present invention. Whereas FIG. 3 shows an embodiment in which 10 parallel pieces of data D0 to D9 of the lines P0 to P9 are serially converted into one serial line S, FIG. 4 shows an embodiment in which among 10 parallel pieces of data P0 to P9, rising data P0, P2, P4, P6 and P8, which are pieces of data arrayed at the logic high levels of a clock CLK, are serially arrayed to a line RD0, while falling data P1, P3, P5, P7 and P9, which are pieces of data arrayed at the logic high levels of an inverted clock CLKB, are serially arrayed to a line FD0.

As shown in FIG. 4, a parallel-to-serial conversion circuit includes a shifter 410, a rising valid duration generator 430, a falling valid duration generator 440, a rising output unit 450, and a falling output unit 460. The shifter 410 generates a plurality of rising transfer activation signals A1, A3, A5, A7 and A9 that are synchronized with the clock CLK and a plurality of falling transfer activation signals A0, A2, A4, A6 and A8 that are synchronized with an inverted clock CLKB by sequentially shifting an initiation signal START based on a clock CLK and an inverted clock CLKB.

The rising valid duration generator 430 defines valid durations of rising pieces of data P0, P2, P4, P6, and P8, from among the plurality of pieces of parallel data P0 to P9, based on the clock CLK and the falling transfer activation signals A0, A2, A4, A6 and A8. The falling valid duration generator 440 defines valid durations of falling pieces of data P1, P3, P5, P7, and P9, from among the plurality of pieces of parallel data P0 to P9, based on the clock CLKB and the rising transfer activation signals A1, A3, A5, A7 and A9.

The rising output unit 450 receives a plurality of pieces of parallel data V0, V2, V4, V6, and V8 whose valid duration is defined by the rising valid duration generator 430 and drives a rising output RD0 in response to a piece of data whose valid duration has begun, from among the inputted pieces of parallel data V0, V2, V4, V6, and V8 whose valid duration is defined. The falling output unit 460 receives a plurality of pieces of parallel data V1, V3, V5, V7, and V9, whose valid duration is defined by the falling valid duration generator 440, and drives a falling output FD0 in response to a piece of data whose valid duration has begun, from among the inputted pieces of parallel data V1, V3, V5, V7, and V9 whose valid duration is defined.

The shifter 410 sequentially shifts the initialization signal START in synchronization with the clock CLK and the clock CLKB. Among the sequentially shifted signals A0 to A9, signals synchronized with the clock CLK become rising transfer activation signals A1, A3, A5, A7, and A9, while signals synchronized with the clock CLKB become falling transfer activation signals A0, A2, A4, A6, and A8. The shifter 410 may be easily formed to include D flip-flops operating in synchronism with the clock CLK or the clock CLKB, as illustrated in the drawing.

The rising valid duration generator 430 defines the valid duration of the rising pieces of data P0, P2, P4, P6 and P8 based on the clock CLK and the falling transfer activation signals A0, A2, A4, A6 and A8. Herein, defining a valid duration signifies that pieces of parallel data V0, V2, V4, V6, and V8, whose valid duration is defined, are set at a predetermined logic level regardless of a data value during a duration that is not their valid duration.

The falling valid duration generator 440 defines the valid durations of the falling pieces of data P1, P3, P5, P7, and P9 based on the clock CLKB and the rising transfer activation signals A1, A3, A5, A7 and A9. Herein, defining a valid duration signifies that pieces of parallel data V1, V3, V5, V7, and V9, whose valid duration is defined, are set at a predetermined logic level regardless of a data value during a duration that is not their valid duration.

The rising valid duration generator 430 and the falling valid duration generator 440 are the same as the valid duration generator 330 shown in FIG. 3, except that a part for defining the valid durations of the pieces of rising data P0, P2, P4, P6 and P8 and a part for defining the valid durations of the pieces of falling data P1, P3, P5, P7, and P9 are divided and respectively controlled by the rising valid duration generator 430 and the falling valid duration generator 440. Therefore, a further description thereof has not been provided herein.

The rising output unit 450 receives the rising pieces of data V0, V2, V4, V6, and V8 whose valid duration is defined and drives a rising output RD0 in response to a piece of data whose valid duration has begun, from among the inputted pieces of rising data V0, V2, V4, V6, and V8 whose valid duration is defined. The rising output unit 450 includes a pull-up driving element 451 for pull-up driving the rising output RD0 and a pull-down driving element 452 for pull-down driving the rising output RD0. A transistor PM01 of the pull-up driving element 451 operates upon receipt of the clock CLKB. Thus, the pull-up driving element 451 operates only during a duration in which the clock CLK is a logic high. A transistor NM01 of the pull-down driving element 452 operates upon receipt of the clock CLK. Thus, the pull-down driving element 452 operates only during a duration in which the clock CLK is a logic high. In other words, the rising output unit 450 operates only during a duration in which the clock CLK is a logic high. The pull-down driving element 452 includes parallel transistors NM02 to NM06 receiving the rising pieces of data V0, V2, V4, V6, and V8 whose valid duration is defined. Since the parallel transistors NM02 to NM06 operate based on the same principle as the parallel transistors 371 to 380 described above with reference to FIG. 3, a further description thereof has not been provided herein.

The falling output unit 460 receives the rising pieces of data V1, V3, V5, V7, and V9 whose valid duration is defined and drives a falling output FD0 in response to a piece of data from among the inputted falling pieces of data V1, V3, V5, V7 whose valid duration has begun, and V9 V8 whose valid duration is defined. The falling output unit 460 includes a pull-up driving element 461 for pull-up driving the falling output FD0 and a pull-down driving element 462 for pull-down driving the falling output FD0. A transistor PM02 of the pull-up driving element 461 operates upon receipt of the clock CLK. Thus, the pull-up driving element 461 operates only during a duration in which the clock CLK is a logic low. A transistor NM07 of the pull-down driving element 462 operates upon receipt of the inverted clock CLKB. Thus, the pull-down driving element 462 operates only during a duration in which the clock CLK is a logic low. In other words, the falling output unit 460 operates only in a duration in which the clock CLK is a logic low. The pull-down driving element 462 includes parallel transistors NM08 to NM012 receiving the falling pieces of data V1, V3, V5, V7, and V9 whose valid duration is defined. Since the parallel transistors NM08 to NM12 operate based on the same principle as the parallel transistors 371 to 380 described with reference to FIG. 3, a further description thereof has not been provided herein.

Semiconductor memory devices generally employ the parallel-to-serial conversion method in which rising pieces of data P0, P2, P4, P6 and P8 are gathered and arrayed in series, and falling pieces of data are gathered and arrayed in series.

Figure 5:
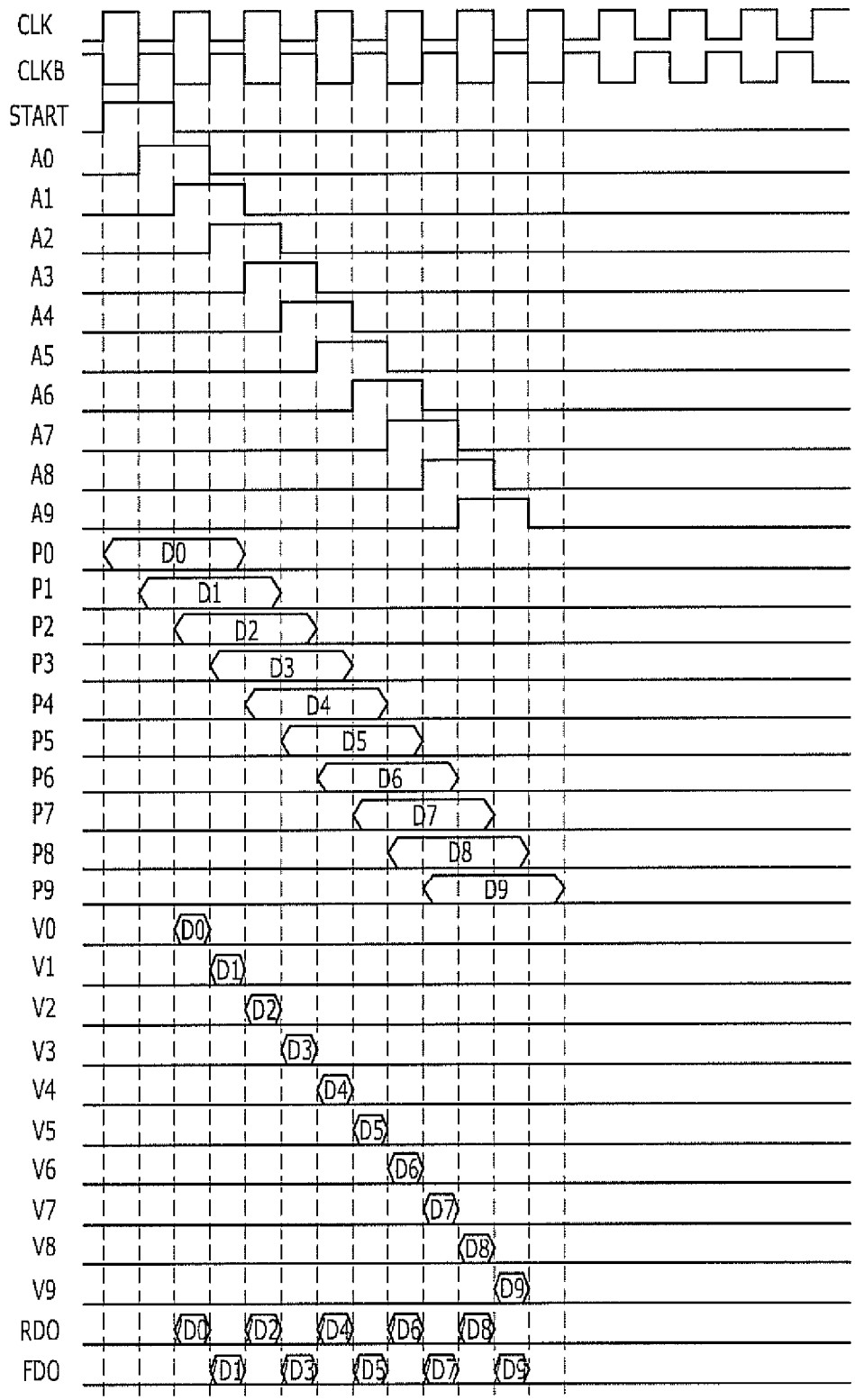
FIG. 5 is a timing diagram illustrating the operation of the parallel-to-serial conversion circuit shown in FIG. 4.

FIG. 5 is a timing diagram illustrating the operation of the parallel-to-serial conversion circuit shown in FIG. 4. Referring to FIG. 5, an initiation signal START is shifted to generate rising transfer activation signals A1, A3, A5, A7 and A9 and falling transfer activation signals A0, A2, A4, A6 and A8. Durations in which both the clock CLK and the falling transfer activation signals A0, A2, A4, A6 and A8 are a logic high are defined as the valid durations of the rising pieces of data P0, P2, P4, P6 and P8 to generate rising pieces of data V0, V2, V4, V6, and V8 whose valid duration is defined. Also, durations in which both the inverted clock CLKB and the rising transfer activation signals A1, A3, A5, A7 and A9 are a logic high are defined as the valid durations of the falling pieces of data P1, P3, P5, P7 and P9 to generate falling pieces of data V1, V3, V5, V7, and V9 whose valid duration is defined.

The rising pieces of data V0, V2, V4, V6, and V8 whose valid duration is defined are transferred to the rising output RD0 during their valid durations. Therefore, rising pieces of data /D0, /D2, /D4, /D6 and /D8 are serially arrayed in the rising output RD0. The falling pieces of data V1, V3, V5, V7, and V9 whose valid duration is defined are transferred to the falling output FD0 during their valid durations. Therefore, falling pieces of data /D1, /D3, /D5, /D7 and /D9 are serially arrayed in the falling output FD0. The reference symbol '/' attached to the pieces of data D0 to D9 represents that they are inverted versions of corresponding pieces of data.

According to the technology of one embodiment of this disclosure, data selection signals to be used for a parallel-to-serial conversion are generated by generating a plurality of signals by shifting an initial signal and combining the shifted signals with a clock. Therefore, it is possible to generate as many data selection signals as desired without dividing a clock, and parallel-to-serial conversion of diverse ratios can be easily performed.

In particular, according to conventional technology, when a parallel-to-serial conversion is not of a 2^N:1 ratio, complicated control is required to perform the parallel-to-serial conversion. However, the technology of this disclosure can easily effect such parallel-to-serial conversion.

Although the embodiments of the present invention discussed above illustrate a parallel-to-serial conversion ratio of 10:1, it is obvious to those skilled in the art to which the present invention pertains that parallel-to-serial conversions of diverse ratios, e.g., 12:1 and 18:1 may be performed based on the principle of the embodiments of the present invention.

While the present invention has been described with respect to specific embodiments, it will be apparent to those skilled in the art that various changes and modifications may be made without departing from the spirit and scope of the present invention as defined by the following claims.

What is claimed is:
1. A parallel-to-serial conversion circuit for converting a plurality of pieces of parallel data into serial data, the parallel-to-serial conversion circuit comprising:
    a shifter configured to sequentially shift an initiation signal to generate a plurality of transfer activation signals, wherein the initiation signal is not a clock signal;

a valid duration generator configured to define valid durations of the plurality of pieces of parallel data based on a clock and the plurality of transfer activation signals; and an output unit configured to receive in parallel the plurality of pieces of parallel data whose valid durations have been defined by the valid duration generator and to drive an output in response to a piece of data from among the received pieces of parallel data that is in the respective valid duration.

2. The parallel-to-serial conversion circuit of claim 1, wherein the shifter shifts the initiation signal based on the clock.

3. The parallel-to-serial conversion circuit of claim 1, wherein the plurality of transfer activation signals are each shifted by ½ clock from another.

4. The parallel-to-serial conversion circuit of claim 1, wherein the valid duration generator defines the valid durations of the plurality of pieces of parallel data so as to not overlap with each other.

5. The parallel-to-serial conversion circuit of claim 4, wherein the valid duration generator sets each of the plurality of pieces of parallel data to a predetermined logic level regardless of its data value during durations other than the respective valid duration.

6. The parallel-to-serial conversion circuit of claim 4, wherein the valid duration generator defines a valid duration of each of the plurality of pieces of parallel data as either a duration in which the clock is a logic high and a respective transfer activation signal is activated or a duration in which the clock is a logic low and the respective transfer activation signal is activated.

7. The parallel-to-serial conversion circuit of claim 5, wherein the valid duration generator includes a plurality of NAND gates that each receives one of the plurality of pieces of parallel data, one of the plurality of transfer activation signals, and the clock.

8. The parallel-to-serial conversion circuit of claim 1, wherein the output unit includes a pull-up driving element for pull-up driving the output and a pull-down driving element for pull-down driving the output, and wherein the pull-down driving element includes a plurality of parallel transistors that each receives at a gate a respective one of the plurality of pieces of parallel data whose valid duration has been defined by the valid duration generator.

9. The parallel-to-serial conversion circuit of claim 1, wherein the initiation signal is activated prior to a parallel-to-serial conversion operation of the parallel-to-serial conversion circuit.

10. A parallel-to-serial conversion circuit for converting a plurality of pieces of parallel data into serial data, the parallel-to-serial conversion circuit comprising:

a shifter configured to sequentially shift an initiation signal based on a clock and an inverted clock to generate a plurality of rising transfer activation signals in synchronism with the clock and a plurality of falling transfer activation signals in synchronism with the inverted clock, wherein the initiation signal is not a clock signal;

a rising valid duration generator configured to define valid durations of rising pieces of data from among the plurality of pieces of parallel data based on the clock and the plurality of falling transfer activation signals;

a falling valid duration generator configured to define valid durations of falling pieces of data from among the plurality of pieces of parallel data based on the inverted clock and the plurality of rising transfer activation signals;

a rising output unit configured to receive the plurality of pieces of parallel data that each have a valid duration defined by the rising valid duration generator and to drive a rising output in response to a piece of data from among the received pieces of parallel data that is in the respective valid duration; and a falling output unit configured to receive in parallel the plurality of pieces of parallel data that each have a valid duration defined by the falling valid duration generator and to drive a falling output in response to a piece of data from among the received pieces of parallel data that is in the respective valid duration.

11. The parallel-to-serial conversion circuit of claim 10, wherein the rising valid duration generator and the falling valid duration generator define the valid durations of the plurality of pieces of parallel data so as to not overlap with each other.

12. The parallel-to-serial conversion circuit of claim 11, wherein the rising valid duration generator and the falling valid duration generator set each of the respective plurality of pieces of parallel data at a predetermined logic level regardless of its data value during durations other than the respective valid duration.

13. The parallel-to-serial conversion circuit of claim 11, wherein the rising valid duration generator defines a valid duration of a received piece of data as a duration in which the clock is a logic high and a respective falling transfer activation signal is activated.

14. The parallel-to-serial conversion circuit of claim 11, wherein the falling valid duration generator defines a valid duration of a received piece of data as a duration in which the inverted clock is a logic high and a respective rising transfer activation signal is activated.

15. The parallel-to-serial conversion circuit of claim 10, wherein the rising output unit includes a pull-up driving element for pull-up driving the rising output and a pull-down driving element for pull-down driving the rising output, and wherein the pull-down driving element includes a plurality of parallel transistors that each receives at a gate a respective one of the plurality of pieces of parallel data whose valid duration has been defined by the rising valid duration generator.

16. The parallel-to-serial conversion circuit of claim 10, wherein the initiation signal is activated prior to a parallel-to-serial conversion operation of the parallel-to-serial conversion circuit.

17. A method for generating a data selection signal to determine an instant in time when a plurality of pieces of parallel data are each transferred to an output to serially transfer the plurality of pieces of parallel data, the method comprising:

generating first to Nth transfer activation signals by sequentially shifting an initiation signal in synchronism with a clock, wherein the initiation signal is not a clock signal and N is a natural number; and generating first to Nth data selection signals that are each activated during a duration in which the clock is at a respective logic level and one of the first to Nth transfer activation signals is activated.

18. The method of claim 17, wherein the first to Nth transfer activation signals are each shifted by ½ clock from another.

19. The method of claim 18, wherein each of the first to Nth transfer activation signals is activated for one clock.

20. The method of claim 18, wherein the generation of the first to Nth data selection signals comprises:

generating odd-number data selection signals from among the first to Nth data selection signals that are each activated during a duration in which the clock is a logic high and a respective one of the first to Nth transfer activation signals is activated; and generating even-number data selection signals from among the first to Nth data selection signals that are each activated during a duration in which the clock is a logic low and a respective one of the first to Nth transfer activation signals is activated.

21. The method of claim 17, wherein the initiation signal is activated prior to a time when the plurality of parallel data is converted and output as serial data.

\* \* \* \* \*